US010877572B1

(12) United States Patent
Laplante

(10) Patent No.: US 10,877,572 B1
(45) Date of Patent: Dec. 29, 2020

(54) SIDEWALL SWITCHES FOR ELECTRONIC DEVICES

(71) Applicant: Boreas Technologies Inc., Bromont (CA)

(72) Inventor: Jean-François Laplante, Cowansville (CA)

(73) Assignee: Boréas Technologies Inc., Bromont (CA)

(*) Notice: Subject to any disclaimer, the term of this patent is extended or adjusted under 35 U.S.C. 154(b) by 0 days.

(21) Appl. No.: 16/699,343

(22) Filed: Nov. 29, 2019

(51) Int. Cl.
*G06F 3/023* (2006.01)
*G06F 1/16* (2006.01)
*H04M 1/02* (2006.01)

(52) U.S. Cl.
CPC ............ *G06F 3/023* (2013.01); *G06F 1/1626* (2013.01); *H04M 1/026* (2013.01)

(58) Field of Classification Search
CPC ....... G06F 3/023; G06F 1/1626; H04M 1/026
USPC ...................................................... 455/575.1
See application file for complete search history.

(56) References Cited

U.S. PATENT DOCUMENTS

| 2013/0319836 A1* | 12/2013 | Chen ...................... G06F 1/182 200/302.2 |
| 2017/0085286 A1* | 3/2017 | Franklin ................. H04M 1/23 |
| 2020/0096770 A1* | 3/2020 | Pedder .................... G02B 3/14 |

* cited by examiner

*Primary Examiner* — Lee Nguyen
(74) *Attorney, Agent, or Firm* — Stratford Managers Corporation; Doug MacLean

(57) ABSTRACT

Mechanical micro-switches, such as the power button, and the volume up and down buttons, in the sidewalls of a smart device's frame remain the weak points in terms of reliability. To overcome this shortcoming a transducer, such as a piezoelectric transducer is placed against the sidewall, and at least one micro-slit is configured in the sidewall forming a flap deflectable into the frame. The micro-slits and the flap enable a displacement in a portion of the sidewall in an otherwise very stiff frame that is large enough to be detected by the transducer when a force is applied by the user and a displacement large enough to be sensed by the user, but not too large so as to risk damage of the transducer or other electronic components inside the frame.

20 Claims, 16 Drawing Sheets

SIDEWALL SWITCHES FOR ELECTRONIC DEVICES

TECHNICAL FIELD

The present disclosure relates to actuators for sidewall switches, and in particular to piezoelectric actuators used as sidewall switches in electronic devices, such as tablets, smart devices, smartphones and watches.

BACKGROUND

Since the invention of cellular phones, micro-switches were used as an input device for several functions. Since the apparition of smartphones with touch sensors, most of the mechanical buttons were replaced by interactions on the touch screen. However, some micro-switches remain, such as the power button, volume up and down, etc. in the sidewalls of the smartphone frame. The mechanical buttons are among the weak points in terms of reliability and require cut-outs in the phone's frames.

The piezoelectric effect is a reversible process, whereby when a force is applied to a piezoelectric material, an electrical charge is generated, and when an electrical charge is applied to a piezoelectric material, a force is generated. The electrical charges can be measured either as a current or a voltage, and provide a good way to estimate the mechanical strain applied on the material. An example application would be to use a piezoelectric material to replace a mechanical switch. Accordingly, when a user presses on a button comprising the piezoelectric material, a voltage/current is generated, whereby this change in voltage/current can be detected by an electronic device, which notifies a system that the user pressed on the button.

The reverse piezoelectric effect has the opposite result. When applying a voltage to a piezoelectric material, a mechanical strain is generated in the piezoelectric material. The strain will create a force and a displacement of the piezoelectric material depending on the application. An example application is in a haptic actuator, in which it is desired to generate a sensation, e.g. a vibration, for providing a sensory feedback to a user. The device will apply a voltage waveform to the haptic actuator to generate the desired sensation. Generally speaking, for useful movement or force, tens to hundreds of volts need to be applied to a piezo actuator to generate a discernable sensation.

For systems in which one or both of sensing and actuating is required, piezoelectric transducers are attractive because the system can use a single element, i.e. the piezoelectric actuator, that will act both as a sensor and an actuator. The dual function element enables applications, such as mechanical button replacement, in which sensing is required to provide a command to the system, and haptic feedback is required to provide a natural user interface to the system.

Piezoelectric transducers convert the force/displacement applied to them into a voltage (sensor) or the voltage applied to them into a force/displacement (actuator). However, the mechanical structure of most electronic devices', e.g. smartphone or tablets, outer frame is usually very stiff. Accordingly, with the current phone designs, the force required to trigger a piezo sensor would be very high. Moreover, the vibration created by the piezo actuator would not be transmitted well to the user through such a rigid structure.

An object of the present invention is to overcome the shortcomings of the prior art by replacing the micro-switches in the sidewalls of electronic devices, such as smartphones or tablets, with piezo electric transducers, so the side walls of the electronic device appear seamless to the user.

SUMMARY OF THE INVENTION

Accordingly, the present invention relates to an electronic device comprising: a frame for enclosing electronic components, the frame including a sidewall, a first micro-slit and a second micro-slit extending through the sidewall, configured to form a flap or strip deflectable into the frame; a top cover mounted on the frame configured to provide a user interface; and a transducer mounted on the inside of the frame against the flap or strip, for controlling an operation of the electronic device, the transducer configured to sense deflection of the flap or strip and/or configured to provide a physical sensation in response to the deflection.

Another aspect of the present invention relates to a housing for an electronic device comprising: a frame for enclosing electronic components, the frame including a sidewall, a first micro-slit and a second micro-slit extending through the sidewall, configured to form a flap or strip deflectable into the frame.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments.

On the contrary, the present teachings encompass various alternatives and equivalents, as will be appreciated by those of skill in the art.

Figure 1:
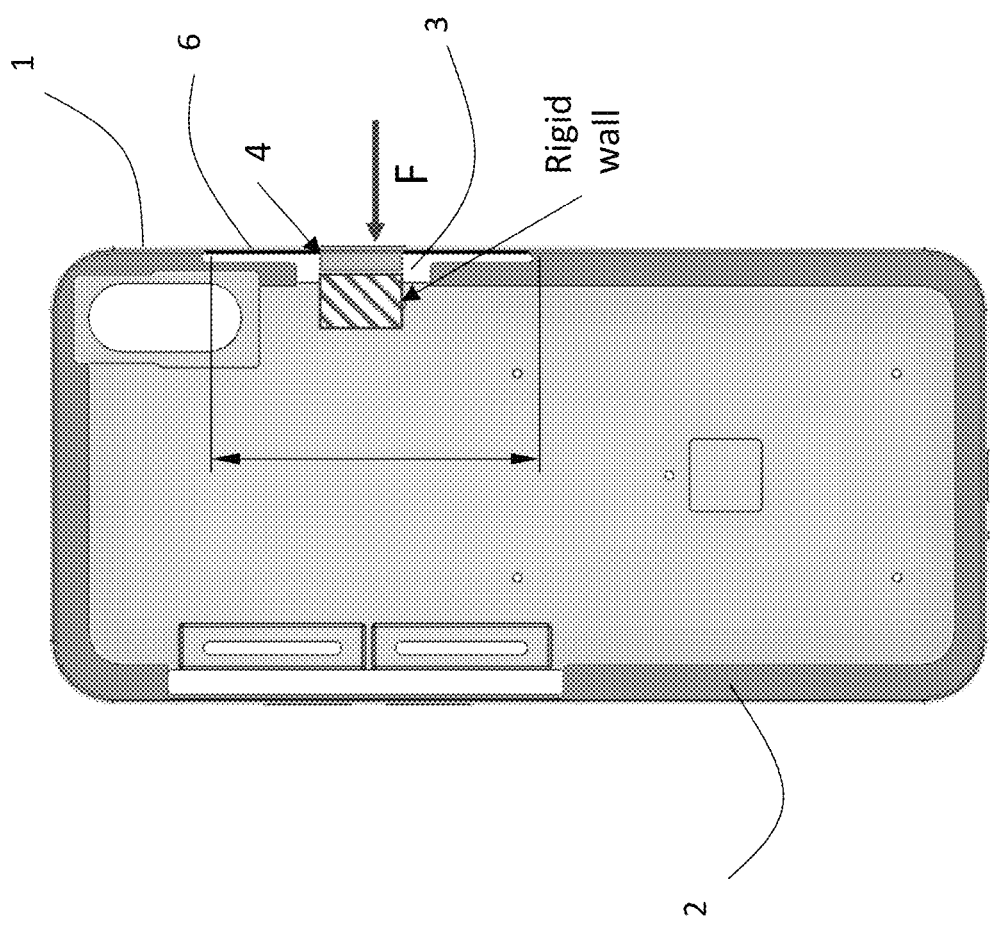
FIG. 1 is an plan view in accordance with an embodiment of the present invention.

A first embodiment, illustrated in FIG. 1, includes a sidewall 1 of an electronic device, e.g. smartphone, frame 2 to include an opening 3, e.g. 10 mm to 70 mm wide, configured to receive one or more transducers, such as a shape memory alloy (SMA) actuator or a piezoelectric transducer 4. A rigid wall, separate from the smartphone frame 2, may be mounted in the opening 3 of the smartphone frame 2 for supporting the piezoelectric transducer 4. A flexible portion 16 of the sidewall 1 may be mounted over the opening 3 in contact with the piezoelectric transducer 4 and contiguous with the outer edge of the smartphone frame 2.

Figure 2B:
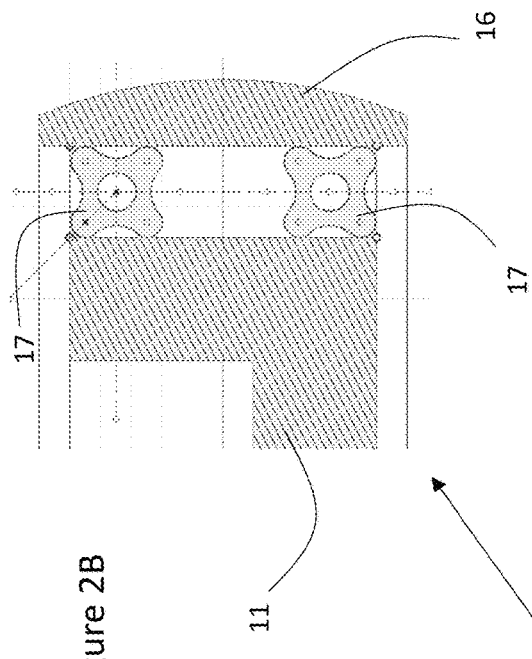
FIG. 2B is a partial cross-sectional view of the device of FIG. 2A.
Figure 2A:
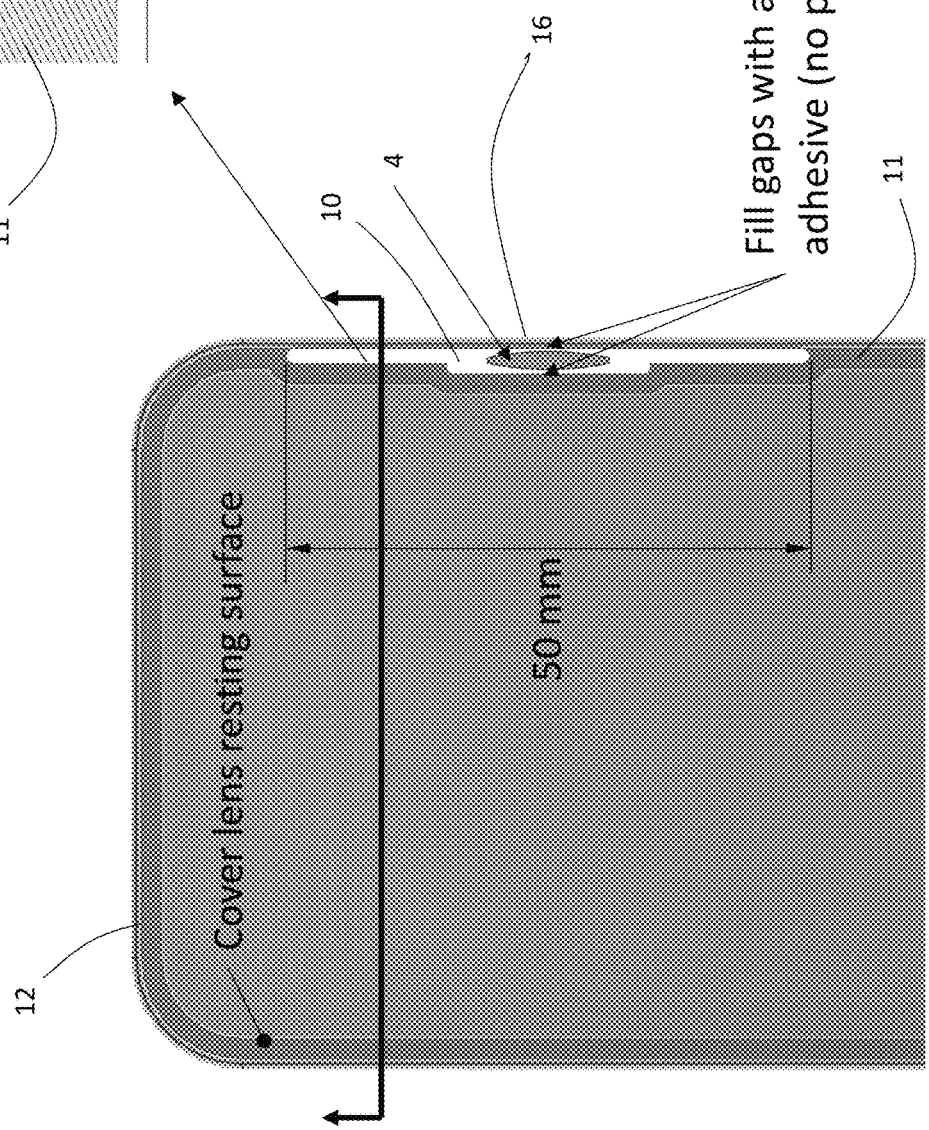
FIG. 2A is a partial plan view in accordance with an embodiment of the present invention.
Figure 3:
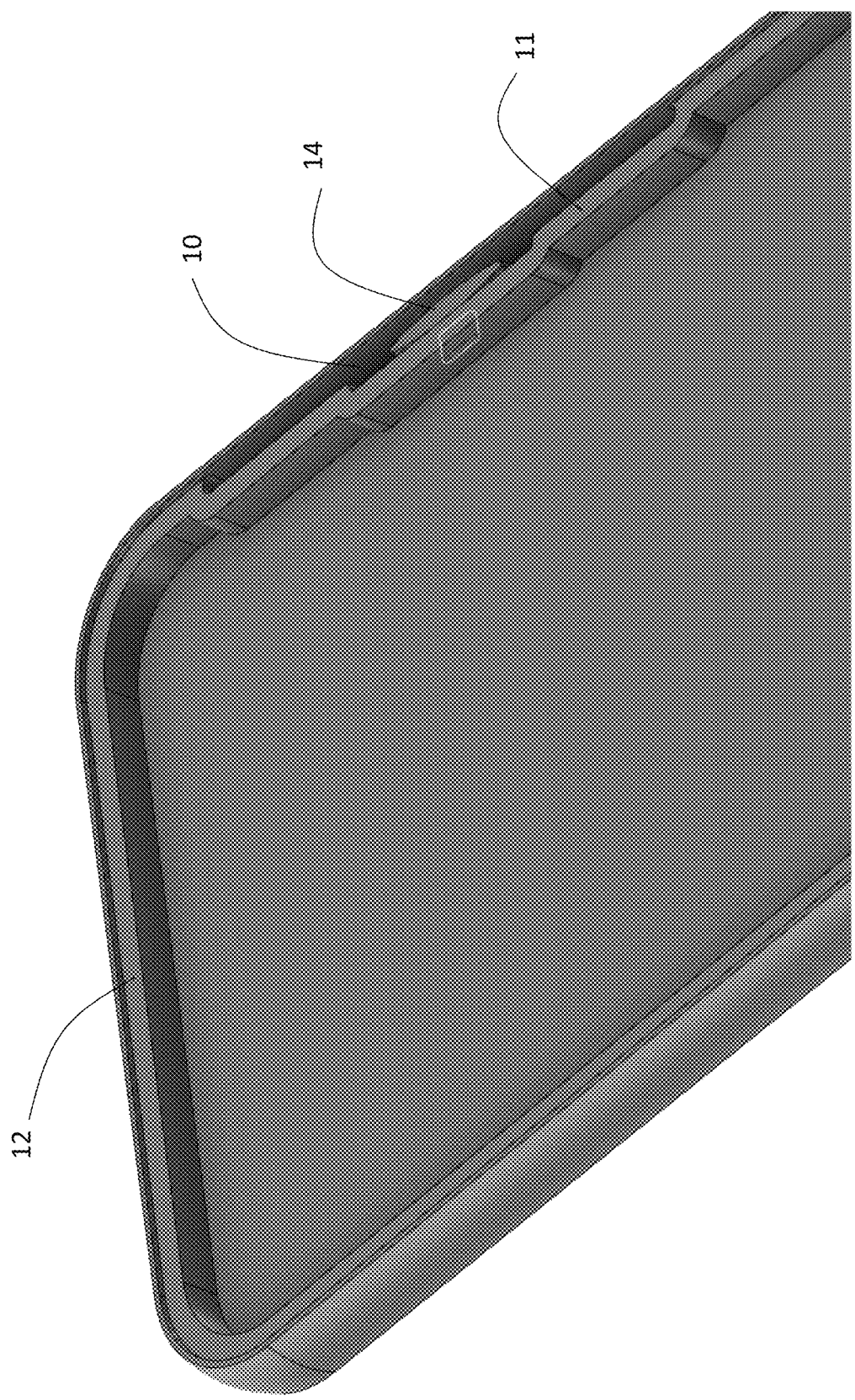
FIG. 3 is a partial isometric view of the device of FIG. 1.

However, in an effort to ensure that the electronic device, e.g. smartphone, is watertight, it is beneficial to provide a resting surface that is continuous with the smart phone frame, i.e. without an openings, to thereby create a hermetic barrier. To circumvent this problem, a geometry as depicted in FIGS. 2A, 2B and 3 in which a pocket 10 is formed in a sidewall 11 of a smart phone frame 12. The piezoelectric transducer(s) 4 may be mounted in the pocket 10. Each piezoelectric transducer 4 may be used for activation or control of any required operations, such as on/off, volume etc. A flexible portion 16 of the sidewall 11 may be mounted over the pocket 10 in contact with the piezoelectric transducer 14 and contiguous with the outer edge of the smartphone frame 12. Gaps between the sidewall 11 in the pocket 10 and the piezoelectric transducer 4, and between the piezoelectric transducer 4 and the flexible portion 16 may be filled with an adhesive, which does not provide any pre-load on the piezoelectric transducer 4. A flex cable for the piezoelectric transducer 4 may extend through a hole in the sidewall 11, which may be filled with resin, glue or an epoxy. Gaskets 17 may be mounted in the pocket 10 between the sidewall 11 and the flexible portion 16 to ensure the pocket 10 is watertight (FIG. 2B).

Figure 4:
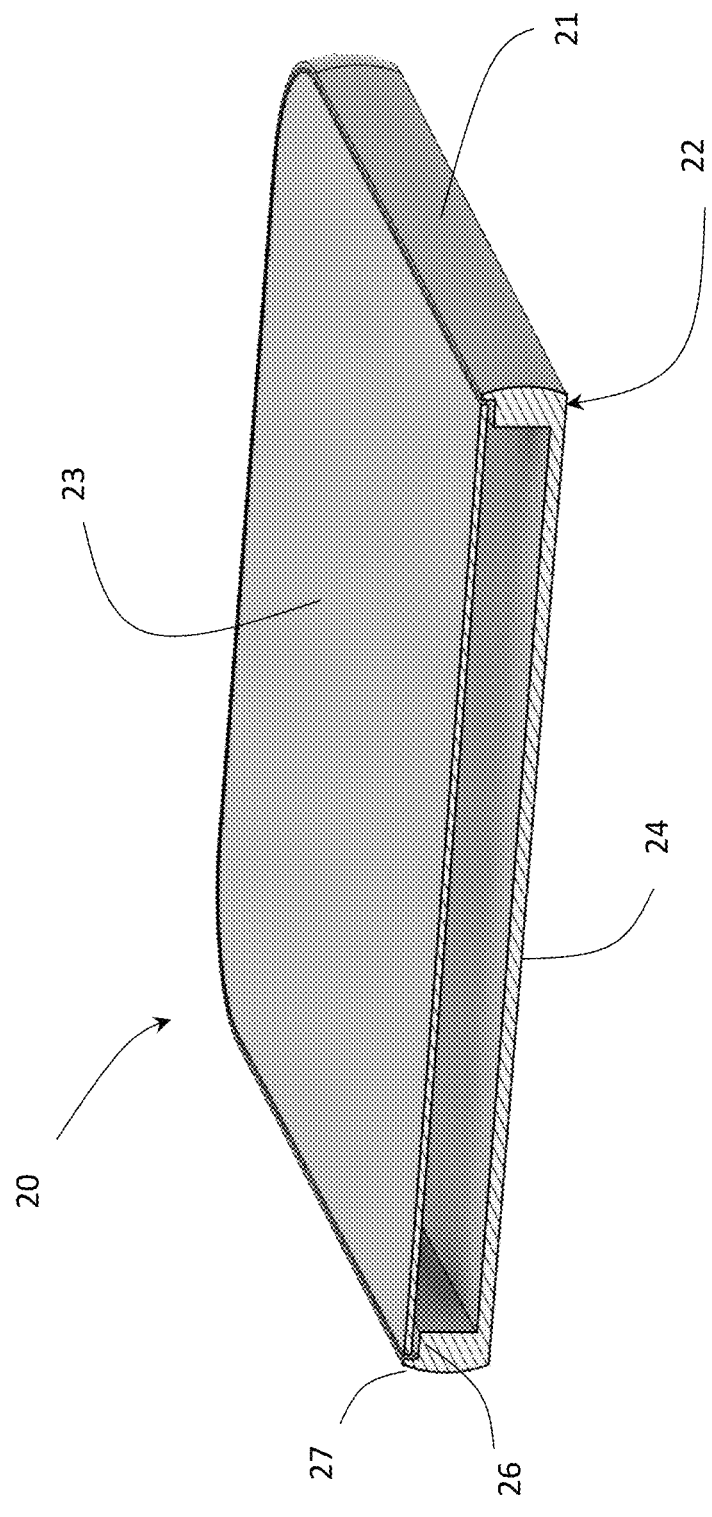
FIG. 4 is a cross-sectional view of a uni-body smartphone architecture.
Figure 5:
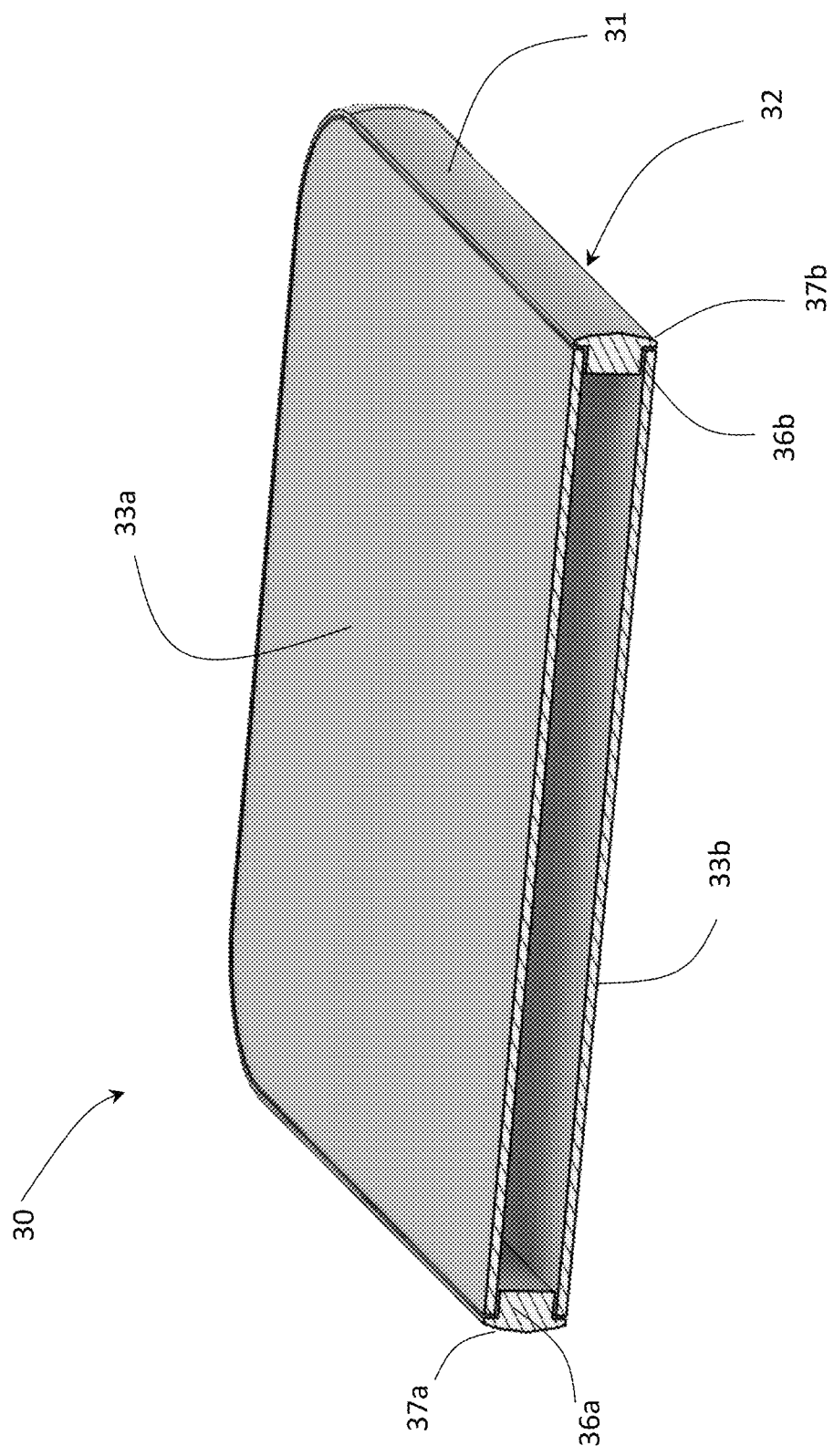
FIG. 5 is a cross-sectional view of a mid-frame smartphone architecture.
Figure 6:
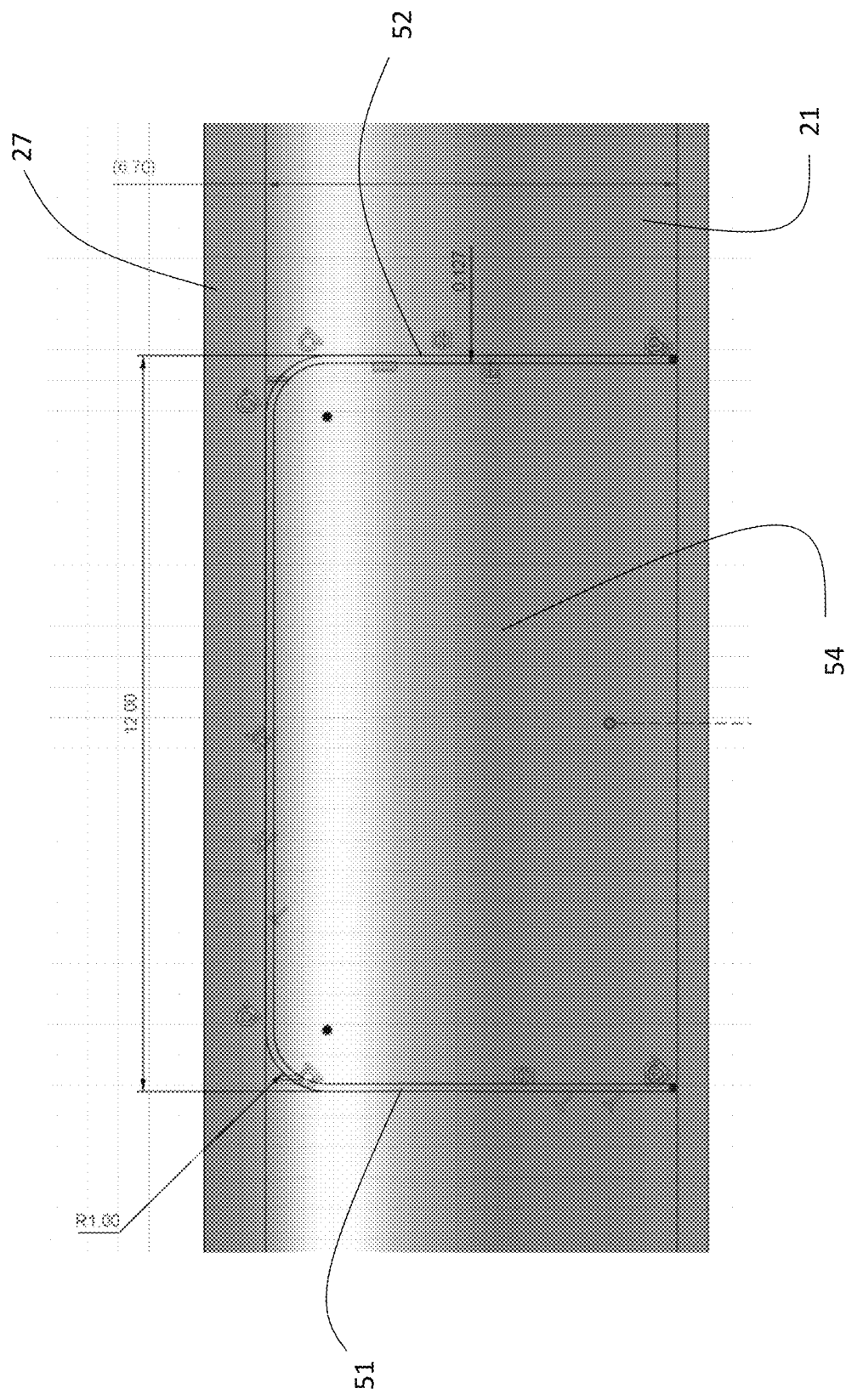
FIG. 6 is a partial side view in accordance with an embodiment of the present invention.

Generally speaking, there are two different electronic device, e.g. smartphone, architectures in the market: unibody, as illustrated in FIG. 4 and mid-frame, as illustrated in FIG. 5, each having their pros and cons, and device makers typically choose one or the other. The unibody architecture for a smartphone housing 20 includes a frame 22 and a cover lens 23 mounted thereon. The cover lens 23 may provide a touchscreen user interface for the smartphone, as is well known in the art. The frame 22 may incorporate a monolithic structure comprising the entire continuous sidewall 21 surrounding the inner electronic components and workings of the smartphone housing 20, and the rear wall 24. The frame 22 may be fabricated of a strong, e.g. Young's modulus >40 GPA, light weight material, such as aluminum, stainless steel, titanium or hard plastics. The sidewall 21 may include an upper shoulder 26 for supporting the cover lens 23, whereby the edge of the cover lens 23 is protected by a ridge 27 extending from the upper shoulder 26 all the way around the outside edge of the frame 22. The sidewall 21 is typically 4 mm to 8 mm in height, and 120 mm to 180 mm in length for a smartphone, (180 mm to 300 for a tablet).

The mid-frame architecture (FIG. 5) for a smartphone housing 30 includes a frame 32, a first cover lens 33a mounted on one side thereof, and a second cover lens 33b mounted on an opposite side thereof. The frame 32 may incorporate the entire continuous sidewall 31 surrounding the inner workings of the smartphone housing 30. The frame 32 may be fabricated of a strong, e.g. Young's modulus >40 GPa, light weight, material, such as aluminum stainless steel, titanium or hard plastics. The sidewall 31 may include a first shoulder 36a for supporting the first cover lens 33a, whereby the edge of the first cover lens 33a is protected by a first ridge 37a extending from the first shoulder 36a all the way around the outside edge of the frame 32. The sidewall 31 may also include a second shoulder 36b for supporting the second cover lens 33b, whereby the edge of the second cover lens 33b is protected by a second ridge 37b extending from the second shoulder 36b all the way around the outside edge of the frame 32. One or both of the cover lenses 33a and 33b may provide a touchscreen user interface for the smartphone, as is well known in the art.

With reference to FIGS. 6-10, another possible implementation, particularly suited for the unibody architecture, includes the introduction of a pair of first and second micro-slits 51 and 52 extending through the sidewall 21 or the sidewall 31. In the embodiment illustrated in FIG. 6, the first and second micro-slits 51 and 52 are parallel to each other and extend perpendicular to the length of the sidewall 21 or 31, i.e. extending along the height of the sidewall 21 or 31. Non-parallel first and second micro-slits 51 and 52 are possible. A third micro-slit 53 may be included for joining the ends of the first and second micro-slits 51 and 52 forming a C-shaped micro-slit, extending up a portion of the height of the sidewall 21 or 31, along a portion of a length of the sidewall 21 or 31 and back down a portion of the height of the sidewall 21 or 31. The C-shaped micro-slit, comprised of the first, second and third micro-slits 51, 52 and 53 defines a beam, strip or flap 54 in the sidewall 21 or 31 by releasing a plurality of, e.g. three, sides of the beam, strip or flap 54 from the sidewall 21 or 31.

The goal of the first, second and third micro-slits 51, 52 and 53 and the flap 54 is to produce a displacement in a portion of the sidewall 21 or 31 in an otherwise very stiff frame 2 that is large enough to be detected by the transducer 4 when a force is applied by the user and reversely, a displacement large enough to be sensed by the user as vibrational feedback, but not too large so as to risk damage of the transducer(s) 4 or other electronic components inside the frame 2. The geometry of the first, second and third micro-slits 51, 52 and 53 may be configured to typically enable a displacement of the strip, beam or flap 54 in the 5 to 30 microns, preferably to only 5 to 20 microns, range when a 3-5 N force is applied on the C-shaped flap 54 created by the first, second and third micro-slits 51, 52 and 53. The width (5 mm to 50 mm, preferably about 12 mm) of the flap 54 and the height of the flap 54 (3 mm to 9 mm, preferably about 4 mm-6 mm) may vary. The first, second and third micro-slits 51, 52 and 53 may be 0.05 mm to 0.3 mm wide, preferably 0.08 mm to 0.25 mm, and more preferably about 0.13 mm wide, and extend through the thickness of the sidewall 21 or 31.

According to the equation $F=kx$, the displacement x of the flap 54, will be the resultant of the force F applied by the user divided by the spring constant k of the flap 54. Accordingly, the geometry of the first, second and third micro-slits 51, 52 and 53 may be optimized to achieve a desired spring constant k. To provide a good feedback to the user, the spring constant k should be as low as possible; however, this is limited by physical and geometrical constraints of the sidewall 21 or 31. Prior experiments have shown that a spring constant k of 50 N/mm to 150 N/mm, preferably 70 N/mm, gives an excellent feedback. However, with real life constraints, the spring constant k may be from 50 N/mm, preferably 70 N/mm up to as high as 1000 N/mm. The trade off is in ensuring that the housing 20 or 30 and the frame 22 or 32 meeting the environmental requirements, e.g. drop tests and impact tests, versus having a sidewall 21 or 31 flexible enough to transfer the applied and return forces.

Figure 7:
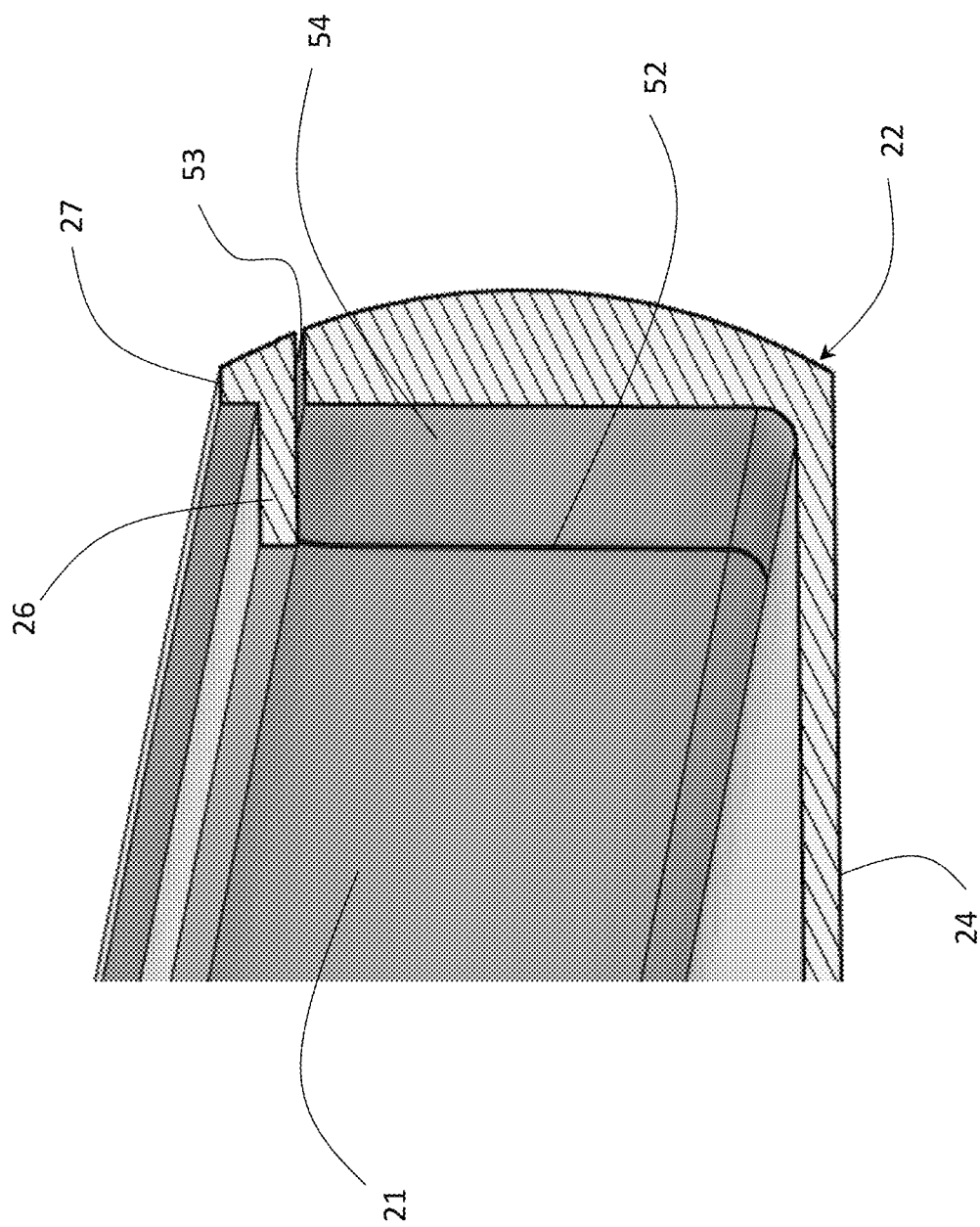
FIG. 7 is a partial cross-section view of the device of FIG. 6.

As illustrated in FIG. 7, the first and second micro-slits 51 and 52 may extend all the way from the top of the sidewall 21, e.g. the bottom of the shoulder 26, to the bottom of the sidewall 21, e.g. proximate the bottom wall 24.

Figure 8:
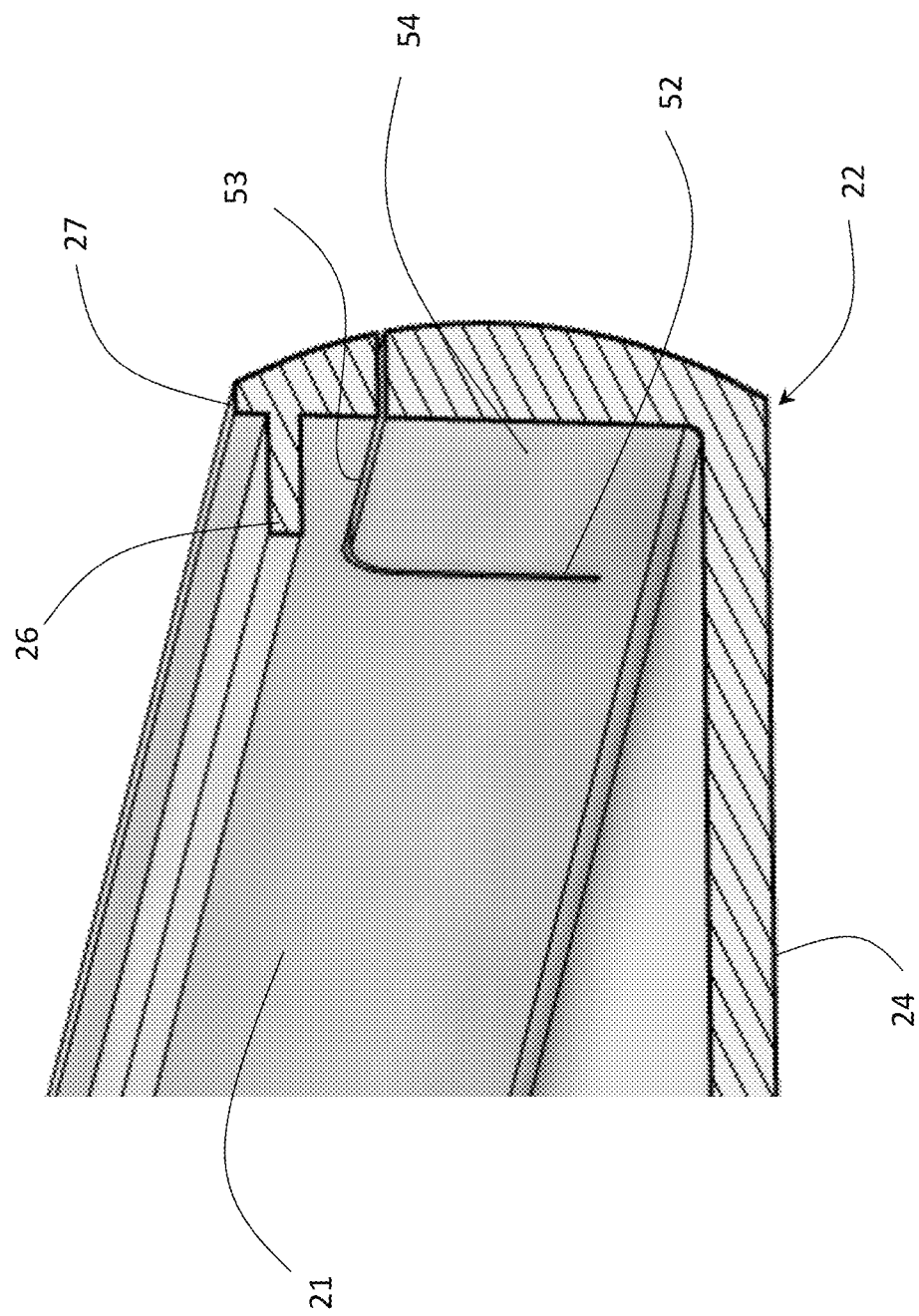
FIG. 8 is a partial cross-section view in accordance with an embodiment of the present invention.

Alternatively, as illustrated in FIG. 8, the first and second micro-slits 51 and 52 may extend from a first location spaced from the bottom of the sidewall 21 to a second location spaced from the top of the sidewall 21 to create area around the flap 54 for a flexible membrane 55 to create a seal around the flap 54 to prevent against ingress or passing of moisture through the first, second and third micro-slits 51, 52 and 53 into the frame 22 and into contact with the electronic components. The first and second locations may be spaced from the top and bottom of the sidewall 21, respectively, between 10%-25% of the total height of the sidewall 21, e.g. 1 mm to 3 mm.

Figure 9:
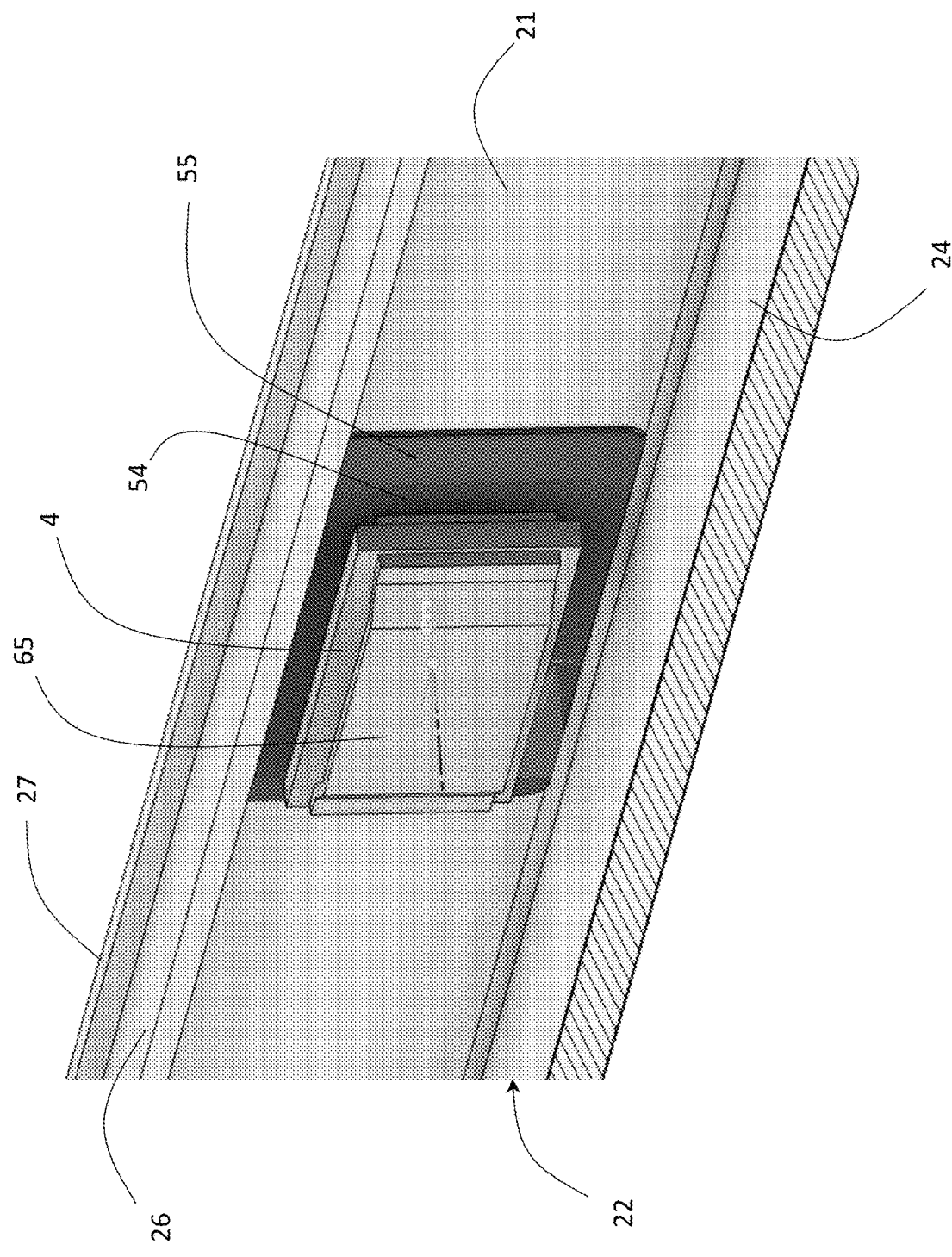
FIG. 9 is a partial isometric view of the device of FIG. 8.

With reference to FIG. 9, one side of each piezoelectric transducer 4 may be mounted against the flap 54, while the opposite side of each piezoelectric transducer 4 should be mounted up against a rigid wall 65 provided inside the frame 22. The piezoelectric transducer(s) 4 may be used for activation or control of any required operations, such as on/off, volume etc. A plurality of transducers 4 may be disposed against a single flap 54, e.g. for volume control, and a logic algorithm may be provided in the form of computer software stored in the electronic device's non-transitory memory and executable on the electronic device's controller, whereby when a first one of the plurality of transducers 4 is activated the others are temporarily disabled until the first one is released.

The thin and flexible membrane 55 is used to create a watertight barrier, while still allowing displacement of the 'beam' or flap 54 created by the first, second and third micro slits 51, 52 and 53. The membrane material may be held in place with adhesive or compression or any other means that will prevent water from getting through the first, second and third micro slits 51, 52 and 53 into contact with the electronic components.

Figure 10:
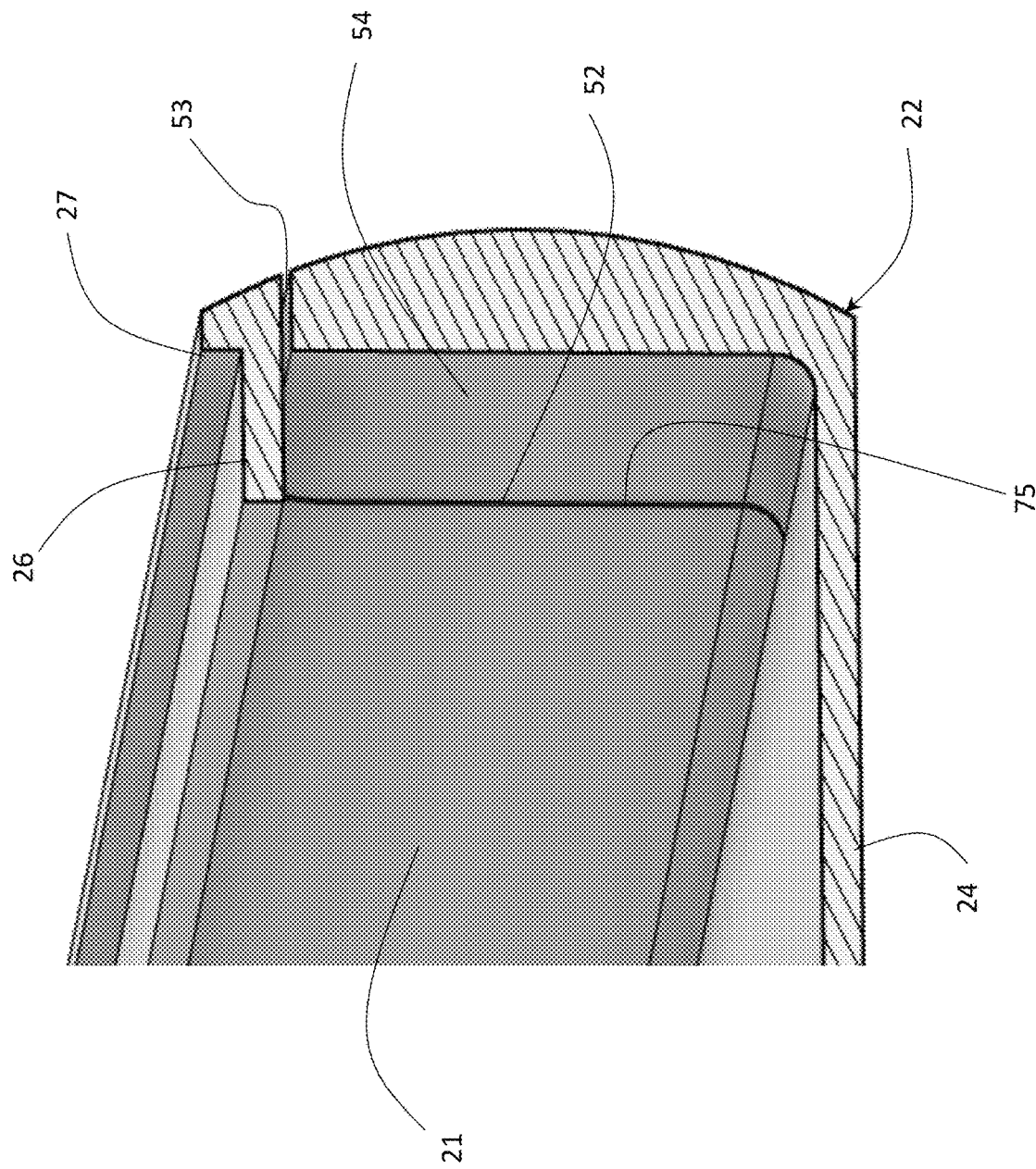
FIG. 10 is a partial cross-section view in accordance with an embodiment of the present invention.

In an alternate embodiment, illustrated in FIG. 10, the first, second and third micro-slits 51, 52 and 53 may be filled with a flexible filler material 75, such as a thermoplastic elastomer, silicone, polyurethane or any material that will create a watertight seal while allowing displacement of the strip, beam or flap 54.

Figure 11:
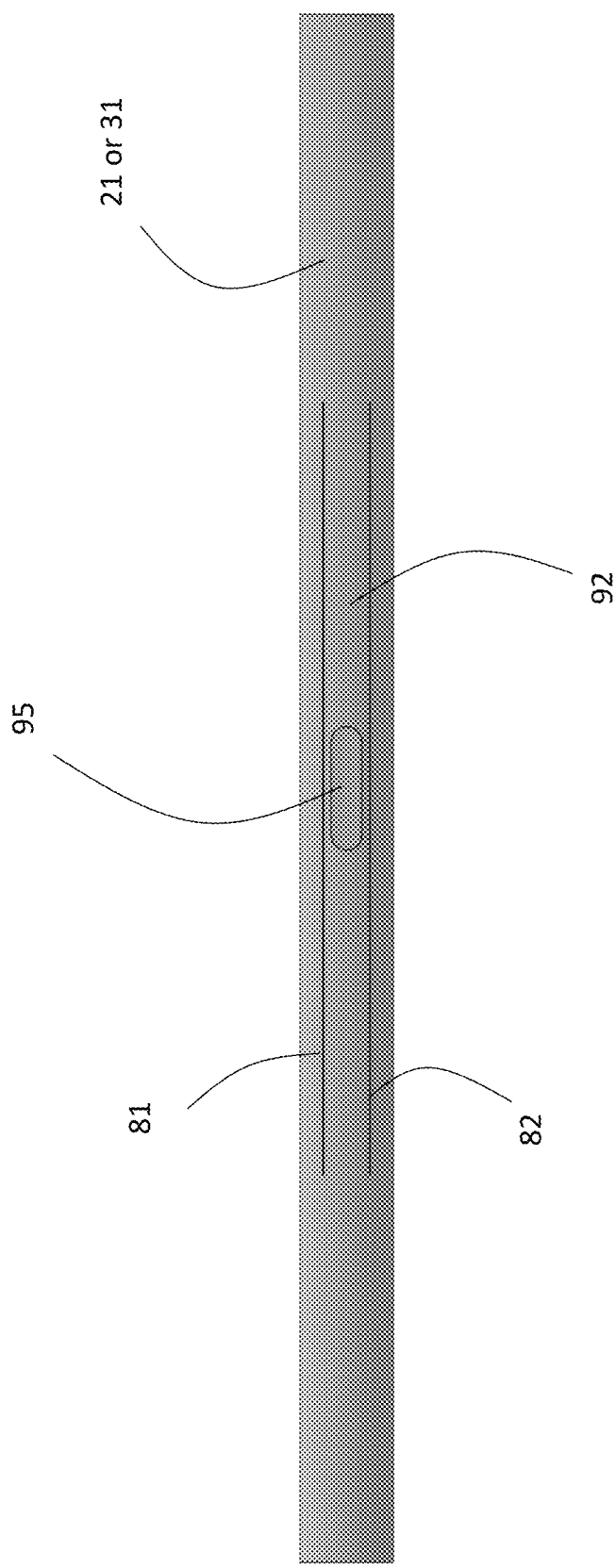
FIG. 11 is a side view in accordance with an embodiment of the present invention.
Figure 12:
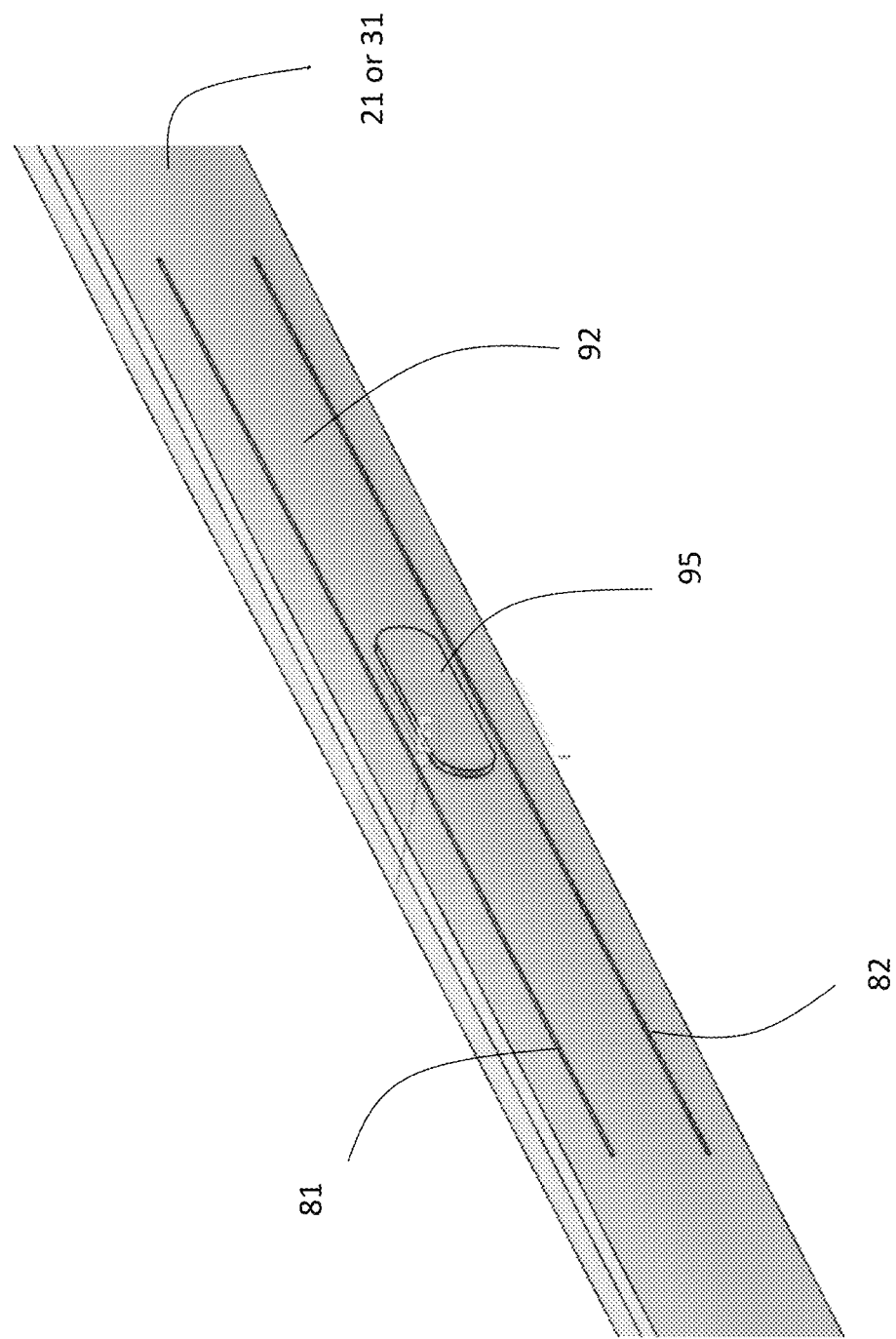
FIG. 12 is a partial isometric view of the device of FIG. 11.
Figure 13:
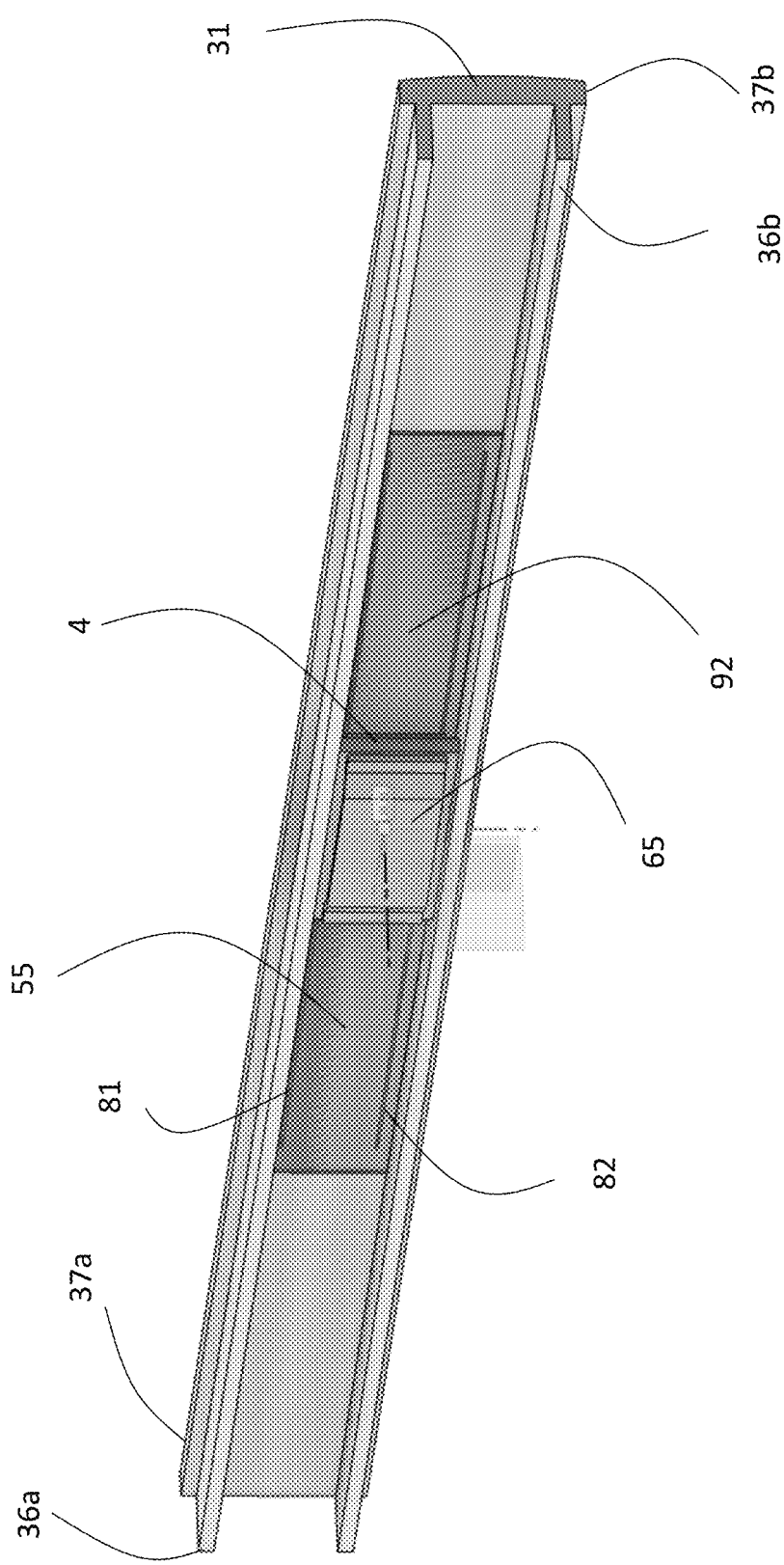
FIG. 13 is a partial isometric view of the device of FIG. 11.

In an alternate embodiment, particularly suited for the mid-frame architecture, illustrated in FIGS. 11 to 13, two micro-machined slits 81 and 82 extend along a length of the sidewall 31, e.g. 30 mm to 75 mm long, preferably about 50 mm long.

In the embodiment illustrated in FIGS. 11-13, the micro-slits may consist only of a pair of first and second micro-slits 81 and 82 may be parallel and extend along a length of the sidewall 21 or 31 forming a beam, strip or flap 92 in the sidewall 21 or 31 by releasing a plurality of, e.g. two, sides of the beam, strip or flap 92 from the sidewall 21 or 31. Non-parallel first and second micro-slits 81 and 82 are possible. The spring constant k for the beam, strip or flap 92 defined by the lengthwise first and second micro-slits 81 and 82 may also range between 50 N/mm to 150 N/mm depending on the length thereof and the material of the sidewall 21 or 31. Since the geometry of the lengthwise micro-slits 81 and 82 enables a longer beam, strip or flap 92, then the widthwise flap 54, a displacement of the beam, strip or flap 92 in the 5 to 30 microns, preferably 5 to 20 microns range may be provided when a force of 0.5 N to 2 N s applied on the strip or beam 92. A raised tab 95 may be provided on the beam, strip or flap 92 proximate the middle thereof, to provide an indication of an optimum force application location.

The length of the first and second micro-slits 81 and 82, may vary between 30 mm and 70 mm, preferably about 50 mm, and the distance apart may vary between, e.g. 4 mm to 8 mm. The first and second micro-slits 81 and 82 may be 0.05 mm to 0.3 mm wide, preferably 0.08 mm to 0.25 mm, and more preferably about 0.13 mm wide, and extend through the thickness of the sidewall 21 or 31. The first and second micro-slits 81 and 82 may be positioned near the top and bottom of the sidewalls 21 or 31, respectively, e.g. proximate to the shoulders 36a and 36b, or the first and second micro-slits 81 and 82 may be positioned as locations, that are spaced from the top and bottom of the sidewalls 21 and 31 to enable the membrane 55 to be mounted above and below the micro-slits 81 and 82.

The first and second locations may be spaced from the top and bottom of the sidewall 31, respectively, between 10%-25% of the total height of the sidewall 31, e.g. 1 mm to 3 mm.

With reference to FIG. 13, one side of each transducer 4 may be mounted against the strip or beam 92, while the opposite side of each transducer 4 should be mounted up against a rigid wall 65 provided inside the frame 32. The transducer(s) 4 may be used for activation or control of any required operations, such as on/off, volume etc. A plurality of transducers 4 may be disposed against a single strip or beam 92, e.g. for volume control, and a logic algorithm may be provided in the form of computer software stored in the electronic device's non-transitory memory and executable on the electronic device's controller, whereby when a first one of the plurality of transducers 4 is activated the others are temporarily disabled until the first one is released.

The membrane 55 may comprise a thin and flexible membrane material may be used to achieve the ingress protection requirement. The membrane 55 may be glued on the inside of the sidewalls 21 or 31 of the frame 22 or 32 covering the first and second micro-slits 81 and 82. Depending on the material chosen, an opening in the membrane 55 may be provided, so the piezoelectric transducer 4 is in direct contact with the strip or beam 92 in the sidewall 21 or 31.

Figure 14:
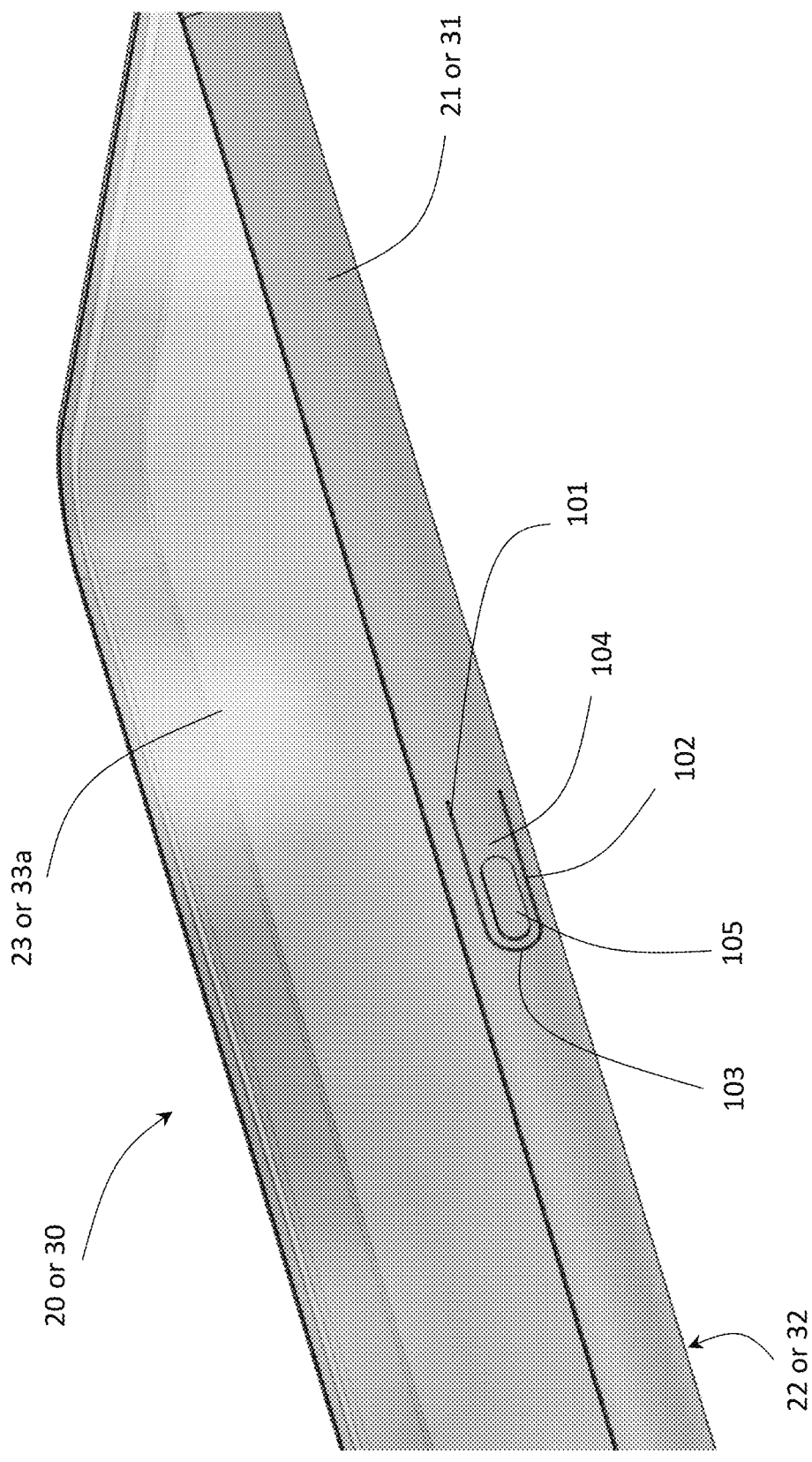
FIG. 14 is a partial isometric view in accordance with an embodiment of the present invention.
Figure 15:
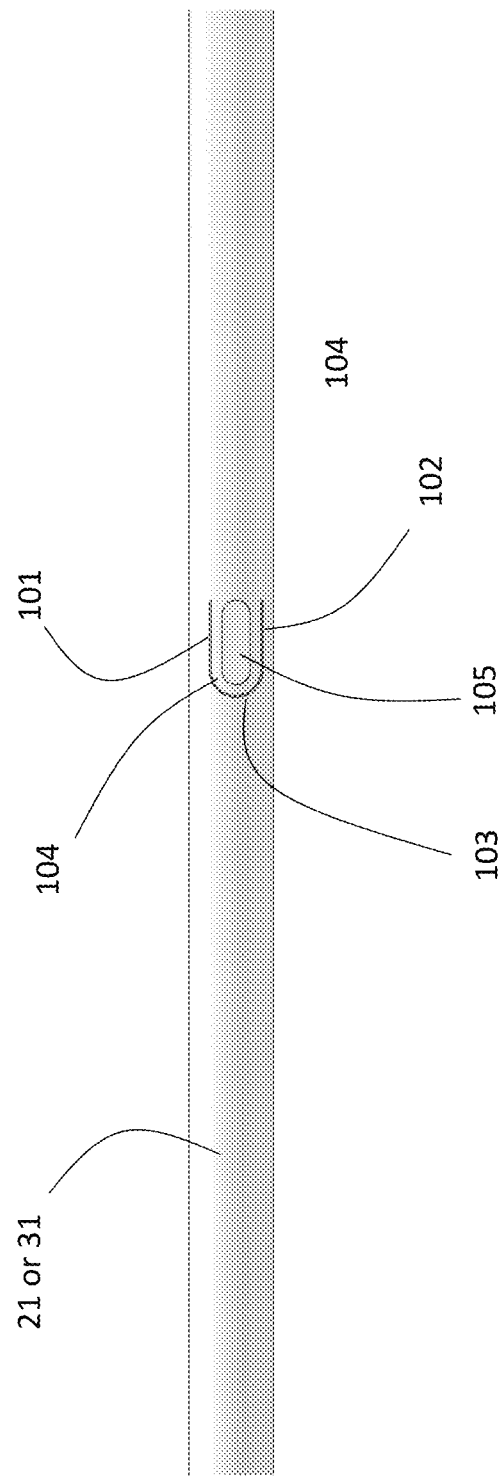
FIG. 15 is a side view of the device of FIG. 14.
Figure 16:
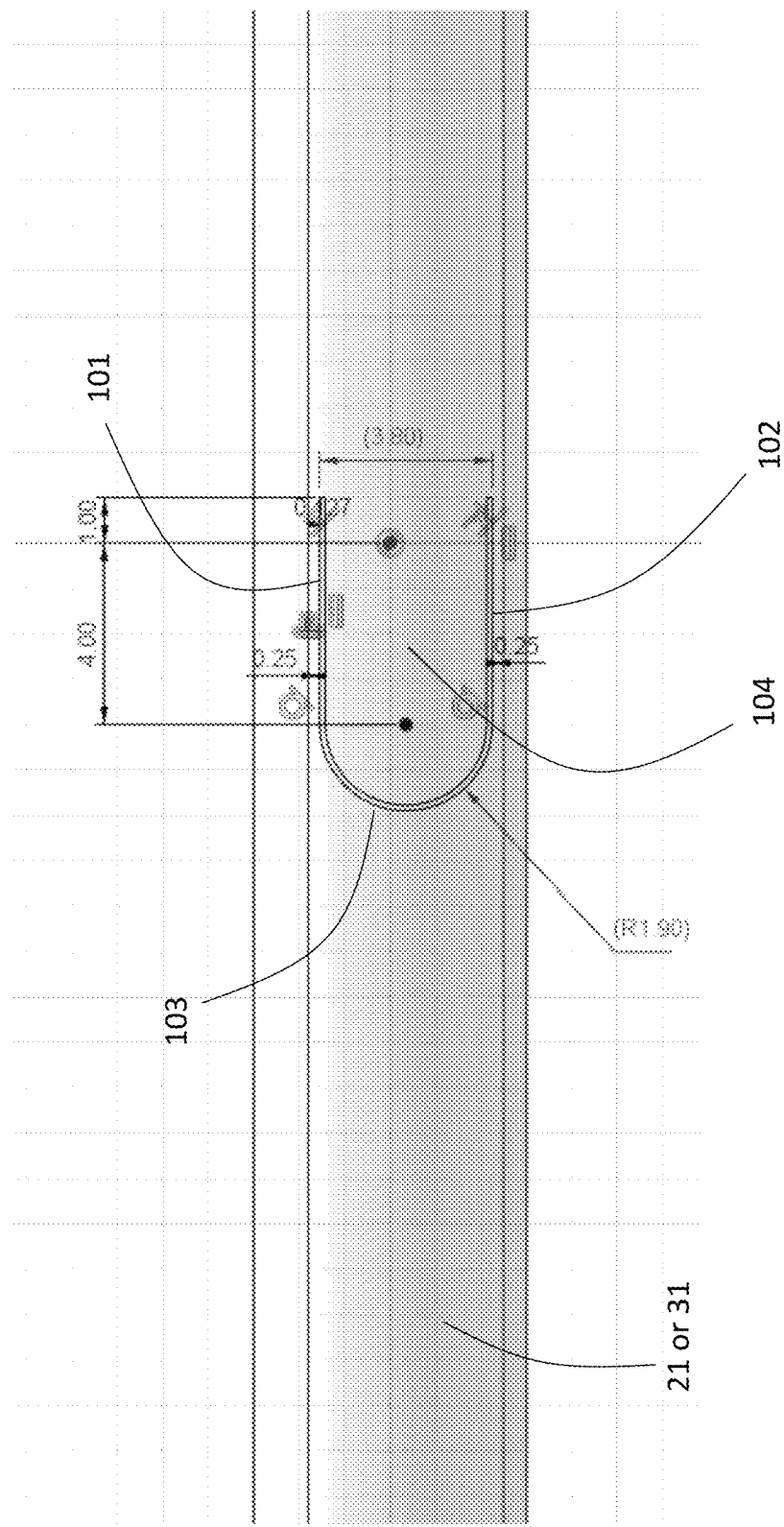
FIG. 16 is a partial side view of the device of FIG. 14.

With reference to FIGS. 14-16, another possible implementation, particularly suited for the unibody architecture, includes the introduction of a pair of first and second micro-slits 101 and 102 extending through the sidewall 21 or the sidewall 31. In the embodiment illustrated in FIG. 14, the first and second micro-slits 101 and 102 are parallel to each other and extend along to the length, i.e. lengthwise, of the sidewall 21 or 31, i.e. extending along the length of the sidewall 21 or 31. Non-parallel first and second micro-slits 101 and 102 are possible. A third micro-slit 103 may be included for joining the ends of the first and second micro-slits 101 and 102 forming a U-shaped micro-slit, extending along a portion of the length of the sidewall 21 or 31, up a portion of the height of the sidewall 21 or 31 and back along a portion of the length of the sidewall 21 or 31. The U-shaped micro-slit, comprised of the first, second and third micro-slits 101, 102 and 103 defines a beam, strip or flap 104 in the sidewall 21 or 31 by releasing a plurality of, e.g. three, sides of the beam, strip or flap 104 from the sidewall 21 or 31. The third micro-slit 103 may extend perpendicular to the length of the sidewall 21 or 31 with rounded corners, as in the third micro-slit 53, or the third micro-slit 103 may comprise an semicircular or arcuate shape forming a rounded end of the beam, strip or flap 104.

A raised tab 105 may be provided on the beam, strip or flap 104 proximate the middle thereof, to provide an indication of an optimum force application location.

The spring constant k for the beam, strip or flap 104 defined by the lengthwise first and second micro-slits 101 and 102 along with the laterally extending third micro-slit 103 may also range between 8.5 N/mm (@ 20 mm) to 969 N/mm (@ 6 mm) depending on the length thereof and the material of the sidewall 21 or 31. A spring constant k of 20 N/mm (@15 mm) to 276 N/mm @ 8 mm is preferable, and a spring constant k of between 50 N/mm and 150 N/mm is more preferable. Since the geometry of the lengthwise first and second micro-slits 101 and 102 along with the third lateral micro-slit 103 enables a longer beam, strip or flap 104, then the widthwise flap 54 or the beam 92, a displacement of the beam, strip or flap 104 in the 5 to 30 microns, preferably 5 to 20 microns range may be provided when a force of 0.5 N to 2 N s applied on the strip or beam 104.

The length of the first and second micro-slits 101 and 102, may vary between 6 mm and 20 mm, preferably about 10-12 mm, and the distance apart may vary between, e.g. 4 mm to 8 mm. The first, second and third micro-slits 101, 102 and 103 may be 0.05 mm to 0.3 mm wide, preferably 0.08 mm to 0.25 mm, and more preferably about 0.13 mm wide, and extend through the thickness of the sidewall 21 or 31. The first and second micro-slits 101 and 102 may be positioned near the top and bottom of the sidewalls 21 or 31, respectively, e.g. proximate to the shoulders 36a and 36b, or the first and second micro-slits 101 and 102 may be positioned as locations, that are spaced from the top and bottom of the sidewalls 21 and 31 to enable the membrane 55 to be mounted above and below the micro-slits 101 and 102.

The first and second locations may be spaced from the top and bottom of the sidewall 31, respectively, between 10%-25% of the total height of the sidewall 31, e.g. 1 mm to 3 mm.

As in FIGS. 9 and 13, one side of each transducer 4 may be mounted against the strip or beam 104, while the opposite side of each transducer 4 should be mounted up against a rigid wall 65 provided inside the frame 22 or 32. The transducer(s) 4 may be used for activation or control of any required operations, such as on/off, volume etc. A plurality of transducers 4 may be disposed against a single strip or beam 104, e.g. for volume control, and a logic algorithm may be provided in the form of computer software stored in the electronic device's non-transitory memory and executable on the electronic device's controller, whereby when a first one of the plurality of transducers 4 is activated the others are temporarily disabled until the first one is released.

The membrane 55 may comprise a thin and flexible membrane material may be used to achieve the ingress protection requirement. The membrane 55 may be glued on the inside of the sidewalls 21 or 31 of the frame 22 or 32 covering the first, second and third micro-slits 101, 102 and 103. Depending on the material chosen, one or more openings in the membrane 55 may be provided, so that each piezoelectric transducer 4 is in direct contact with the strip or beam 104 in the sidewall 21 or 31.

In an alternate embodiment, as illustrated in FIG. 10, the first, second and third micro-slits 101, 102 and 103 may be filled with a flexible filler material 75, such as a thermoplastic elastomer, silicone, polyurethane or any material that will create a watertight seal while allowing displacement of the strip, beam or flap 104.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An electronic device comprising:
   a frame for enclosing electronic components, the frame including a sidewall, a first micro-slit and a second micro-slit extending through the sidewall, configured to form a flap or strip deflectable into the frame;
   a top cover mounted on the frame configured to provide a user interface; and
   a transducer mounted on an inside of the frame against the flap or strip, for controlling an operation of the electronic device, the transducer configured to sense deflection of the flap or strip and/or configured to provide a physical sensation.

2. The device according to claim 1, further comprising a third micro-slit extending from ends of the first micro-slit and the second micro-slit forming a C-shaped micro-slit extending up a portion of a height of the sidewall, along a length of the sidewall and back down a portion of the height of the sidewall defining the flap.

3. The device according to claim 2, wherein the frame further comprises a rear wall, and an upper shoulder for supporting the top cover, which form a monolithic structure with the sidewall;
   wherein the C-shaped micro-slit extends up from a first point spaced apart from the rear wall to a second point spaced apart from the upper shoulder; and
   further comprising a flexible membrane covering the C-shaped micro-slit configured to prevent moisture from passing through the C-shaped micro-slit into the electronic components.

4. The device according to claim 1, wherein the first micro-slit and the second micro-slit consist of a pair of parallel micro-slits extending along a length of the sidewall, thereby defining the strip.

5. The device according to claim 1, further comprising a third micro-slit extending from ends of the first micro-slit and the second micro-slit forming a U-shaped micro-slit extending along a portion of a length of the sidewall, up a portion of a height of the sidewall and back along a portion of the length of the sidewall defining the flap.

6. The device according to claim 1, wherein the flap or strip is configured to only displace 10 to 30 microns in response to a 2 N to 5 N force.

7. The device according to claim 1, wherein each of the first and second micro-slits comprise a width of 0.08 mm to 0.25 mm.

8. The device according to claim 1, wherein the first micro-slit and the second micro-slit are configured whereby the flap or strip comprises a spring constant of between 50 N/mm to 150 N/mm.

9. The device according to claim 1, wherein the first micro-slit and the second micro-slit are configured whereby the flap or strip comprises a spring constant of between 25 N/mm to 1000 N/mm.

10. The device according to claim 1, wherein the transducer comprises a piezoelectric transducer configured to sense the deflection of the flap or strip and provide the physical sensation.

11. The device according to claim 1, wherein the frame comprises a material with a Young's modulus of over 40 GPa.

12. The device according to claim 1, further comprising a flexible membrane covering the first micro-slit and the second micro-slit configured to prevent moisture from passing through the first micro-slit and the second micro-slit into the electronic components.

13. The device according to claim 1, further comprising a flexible filler material inside the first micro-slit and the second micro-slit configured to prevent moisture from passing through the first micro-slit and the second micro-slit into the electronic components.

14. A housing for an electronic device comprising:
a frame for enclosing electronic components, the frame including a sidewall, a first micro-slit and a second micro-slit extending through the sidewall, configured to form a flap or strip deflectable into the frame.

15. The housing according to claim 14, further comprising a third micro-slit extending between ends of the first micro-slit and the second micro-slit defining a C-shaped micro-slit extending up a portion of a width of the sidewall, along a length of the sidewall and back down a portion of the width of the sidewall defining the flap; and wherein the flap defined by the C-shaped micro-slit is 5 mm to 50 mm wide.

16. The housing according to claim 14, further comprising a flexible filler material inside the first micro-slit and the second micro-slit configured to prevent moisture from passing through the first micro-slit and the second micro-slit.

17. The housing according to claim 14, wherein the first micro-slit and the second micro-slit extend parallel to each other along a length of the sidewall defining a strip; and
wherein the strip extends between 30 mm and 70 mm.

18. The housing according to claim 14, wherein each of the first micro-slit and the second micro-slit comprise a width of 0.08 mm to 0.25 mm.

19. The housing according to claim 14, wherein the first micro-slit and the second micro-slit are configured to provide the flap or strip with a spring constant of between 50 N/mm to 150 N/mm.

20. The housing according to claim 14, further comprising a third micro-slit extending from ends of the first micro-slit and the second micro-slit forming a U-shaped micro-slit extending along a portion of a length of the sidewall, up a portion of a height of the sidewall and back along a portion of the length of the sidewall defining the flap.

* * * * *